(12) United States Patent
Sone

(10) Patent No.: US 6,504,228 B1
(45) Date of Patent: Jan. 7, 2003

(54) SEMICONDUCTOR DEVICE AND METHOD FOR MANUFACTURING THE SAME

(75) Inventor: Shuji Sone, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/611,065

(22) Filed: Jul. 6, 2000

(30) Foreign Application Priority Data

Jul. 9, 1999 (JP) .......................................... 11-196063
Dec. 14, 1999 (JP) .......................................... 11-354407

(51) Int. Cl.⁷ .............................................. H01L 29/00
(52) U.S. Cl. ...................... 257/532; 257/295; 257/296; 257/310; 438/381
(58) Field of Search ........................ 361/321.4; 438/381, 438/240, 563, 3, 694; 257/295, 310

(56) References Cited

U.S. PATENT DOCUMENTS

| | | | | |
|---|---|---|---|---|
| 5,798,903 A | * | 8/1998 | Dhote et al. | 361/321.4 |
| 5,837,591 A | * | 11/1998 | Shimade et al. | 438/381 |
| 6,202,233 B1 | * | 2/2000 | Kim | 438/240 |
| 6,043,526 A | * | 3/2000 | Ochiai | 257/295 |
| 6,177,351 B1 | * | 1/2001 | Beratan et al. | 438/694 |
| 6,204,158 B1 | * | 3/2001 | Hendrix et al. | 438/563 |
| 6,238,932 B1 | * | 5/2001 | Aoki et al. | 438/3 |
| 6,246,082 B1 | * | 6/2001 | Mitarai et al. | 257/295 |
| 6,271,559 B1 | * | 8/2001 | Iwasaki et al. | 257/310 |

FOREIGN PATENT DOCUMENTS

| | | |
|---|---|---|
| JP | 9-246494 | 9/1997 |
| JP | 10-173149 | 6/1998 |

OTHER PUBLICATIONS

Lecture Meeting of the 44th Applied Physics Society Association, 1997, vol. 2, p. 437.

Abdelghafar et al, "Mechanism of TiN barrier–metal oxidation in a ferroelectric random access memory", Mater. Res., 1998, vol. 13, p. 3265.

* cited by examiner

Primary Examiner—David Nelms
Assistant Examiner—Mai-Huong Tran
(74) Attorney, Agent, or Firm—Hayes Soloway P.C.

(57) ABSTRACT

A lower electrode film is made to have a crystal grain laminated structure composed of a granular structure crystal grain layer and a columnar structure crystal grain layer. Also, a barrier layer is formed to be a granular structure crystal grain layer made of tantalum nitride containing 10 atm % or more and 50 atm % or less of nitrogen. Thereby, a semiconductor device comprising electrode films wherein both favorable oxygen barrier performance and current conductivity are compatible can be provided.

14 Claims, 5 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device comprising a ferro-electric capacitor or ferro-electric memory composed of highly dielectric materials.

2. Description of the Related Art

Year after year the integration of a semiconductor device has been sophisticated and miniaturization of the circuit used therein has been promoted. Caused by such demand it is required that capacitors maintain their volume while the effective area be smaller and therefore, it is required that films of the capacitors be thinner or highly dielectrics materials be used for the capacitors. With respect to the thickness of the films, the films have reached their lowest possible thickness and electric field strength, which are next to the dielectric breakdown, and it is impossible to make the film thinner. Accordingly, use of dielectrics is indispensible.

Highly dielectric materials mean materials having a higher relative dielectric constant than that of $SiO_2$ and $Si_3N_4$ which have been used for the prior capacitor. Such materials are generally dielectric oxides and when development of such materials was started, monometallic oxide such as $Ta_3O_5$ was examined. In recent years, perovskite dielectrics oxide such as $SrTiO_3$, $Ba_xSr_{1-x}TiO_3$ (BST), $PbSr_xTi_{1-x}O_3$ (PZT), $Pb_{1-y}La_yZr_xTi_{1-x}O_3$ (PLZT), and $SrBi_2Ta_2O_9$ have been studied and if such dielectrics are realized, a capacity of 500 times or more that of the prior capacitor, can be ensured.

In connection with formation of ferro-electric memory, particularly, use of highly dielectric materials such as PZT can contribute to producing ferro-electric nonvolatile memory (FeRAM) that cannot delete information though external voltage is cut off, and so it has been attracting attention. Ferro-electric materials have spontaneous polarization and an electric field can reverse its orientation. Since ferro-electric materials generally have an $ABO_3$ type perovskite constitution (here, A represents one or more elements chosen from Ba, Sr, Pb, La, or divalent metal and B represents one or more elements chosen from Ti, Zr, or tetravalent metal), electric field having the reverse orientation needs to be impressed in order to transfer atoms at B sites to the other stable sites. Therefore, ferro-electric materials show a hysteresis characteristic and even when the electric field is 0, they maintain residual polarization and so are suitable and can be used as a memory. However, when the above mentioned dielectric oxide was employed for forming capacitors and memory, the following problems are produced.

Forming films of the dielectric oxide in an oxidizing atmosphere causes the first problem. Dielectric oxide is formed into films by a sol-gel method or a CVD (chemical vapor deposition) method. With respect to the sol-gel method, gels of metallic compound composing dielectric oxide are applied on the substrate by spinning and the substrate is dried, and then a high temperature, heat treatment is performed for the purpose of crystallizing dielectric oxide, and the heat treatment is carried out in an oxidizing atmosphere to prevent oxygen from being lost. The sputtering method is conducted in plasma containing oxygen and so, this method employs a so-called reactive sputtering style. The CVD method is performed by utilizing such energy as heat, plasma and light, and all these processes are carried out in an oxidation atmosphere to prevent oxygen from being lost.

Since an electrode film of ferro-electric capacitors is composed of the inoxidizable platinum family including Pt, or metals, that are conductive even when they are oxidized, such as Ir, Ru, or Os, forming a film of dielectric oxide in an oxidation atmosphere does not cause any problems. What causes problems is that oxygen infiltrates the electrode film and diffuses while it is being formed, and whereby a contact plug made of polycrystalline Si connected to the electrode film and a barrier layer made of Tin are oxidized. When the contact plug made of polycrystal Si and a barrier layer are oxidized, problems have been brought about in that resistance at the electrode is increased and adhesion is lowered, and accordingly, a ferro-electric capacitor thus produced cannot satisfy required performance and its yielding percentage is poor. For instance, K. Kusida-Abdelghafar et al. reported that when a barrier layer made of TiN was laminated on the Si substrate and thereon a Pt crystal film having a columnar structure was formed as a lower electrode film, while a PZT thin film was being formed, oxygen diffused through the grain boundary of Pt crystals, having a columnar structure and constituting the lower electrode film, over the surface of a TiN film and $TiO_2$ was formed in the midst of Pt in Mater. Res., 1998, Vol.13, p.3265.

The cause of oxygen infiltrating the lower electrode film easily is that the electrode film manufactured by a well-known prior method is composed of crystal grain layers having a columnar structure. Since the crystal grain layers in a columnar structure have large crystal grain diameters and crystal grain boundaries exit along the direction of electric conduction, conductivity is favorable, but oxygen permeability is high as well and so, the oxygen barrier performance is low.

As a means to enhance the oxygen barrier performance of the electrode film Matsui et al. disclosed a method for forming an electrode film, using Pt crystal having a granular structure, which had been difficult in the past and made a report that the oxygen barrier performance was improved compared with that of an electrode film having a columnar structure in the proceedings of the lecture meeting of the 44$^{th}$ Applied Physics Society Association, 1997, Vol. 2, p.437. However, since the granular structure is composed of microcrystal grains, compared with the columnar structure, its oxygen barrier performance was improved, but resistivity was also higher and resulted in conduction failure. Further, crystallinity of the dielectric oxide thin film is affected by that of the touching electrode film and accordingly, when Pt in a granular structure, which is inferior in terms of crystallinity to a columnar structure, was employed as an electrode film, crystallinity of dielectric oxide is also worsened and resulted in lower specific inductive capacity and decreased residual polarization.

The second problem is conduction failure and adhesion failure occurring at the connected surface between respective films, caused by inter diffusion of constituent substances including oxygen occurred through the electrode films between the dielectric oxide thin film and contact plugs or barrier film. This problem causes not only difficulty while the films of dielectric oxide are being formed but also economical difficulty. For instance, the life of dielectric capacitors is shortened and reliability is lowered. More specifically, after a ferro-electric capacity is manufactured, inter diffusion of constituent substances including oxygen gradually occurs through the electrode films and results in conduction failure and peeling at the connected surfaces between respective layers. When the above-mentioned Pt crystals having a columnar structure are used as the electrode films, sufficient conductivity of currents is secured, but substance transfer through grain boundaries of the columnar structure occurs relatively easily. On the other hand, when the electrode films are composed of crystals having a granular structure, barrier performance is high, but conductivity of current is low and the films were not good for practical use.

The third problem is that, when ferro-electric memory is formed of dielectric oxide, rewritability is insufficient. Dielectric oxide has so-called fatigue characteristics, namely a repetition of reverse polarization results in a decrease in residual polarization. The chief causes of the fatigue characteristics are diffusion of the metals constituting the electrode films into the dielectric oxide thin films, leakage currents through crystal grain boundaries in the dielectric oxide thin film, and dispersion of oxygen atoms (oxygen holes) within the lattices of the dielectric oxide thin film. These causes can be eliminated if the crystallinity of the dielectric oxide thin film can be improved. More specifically, if crystallinity of the dielectric oxide thin film is high enough, no defective or amorphous part exists and perfection of crystals is high. Consequently, crystal grain boundaries are small and the substance diffusion into the dielectric oxide thin film, leakage current, generation of oxygen holes are inhibited. To put a ferro-electric memory into practical use, it is essential that a decrease in residual polarization caused by repeated polarization is inhibited and rewritability is improved.

SUMMARY OF THE INVENTION

The object of the present invention is to provide a semiconductor device, wherein electrode films have a crystal grain multi-layer structure containing a columnar structure and a granular structure. Another object of the present invention is to provide a semiconductor device which is 1) equipped with a ferro electric capacitor comprising electric films with both favorable oxygen barrier performance and good current conductivity, or 2) said ferro-electric capacitor maintains good performance for a long time, or 3) equipped with a ferro-electric memory having high rewritability by a method easier and more multi-purpose than investigating a new metallic material for the electrode films.

Further, another object of the present invention is to inhibit an increase in resistance and deterioration of adhesion at the electrodes by improving anti-oxidation characteristics of a barrier film.

A semiconductor device according to the present invention comprises a thin-film capacitor having a dielectric oxide thin film and a pair of electrode films sandwiching said dielectric oxide thin film therebetween. At least one of said pair of electrode films is composed of a crystal grain laminated structure containing a columnar-structure crystal grain layer and a granular structure crystal grain layer.

A semiconductor device according to the another aspect of the present invention comprises a thin film capacitor having a dielectric oxide thin film and a pair of electrode films sandwiching said dielectric oxide thin film therebetween, a contact plug connected to at least one of said electrode films, and a barrier layer formed between said electrode film and contact plug. Said barrier layer is a granular structure crystal grain layer made of tantalum nitride containing 10 atm % or more and 50 atm % or less of nitrogen.

Here, crystal grain layers mean layers made of aggregated crystal grains having the same crystal grain shape. Crystal grain shapes mean the shapes of respective crystals (crystal grains) constituting polycrystal if metallic materials are formed of polycrystals, and there are two kinds of crystal grain shapes of columnar or massive. A granular structure means a thin film structure having columnar crystals growing on the substrate, as stipulated by JIS No. H0211. FIG. 3 illustrates a schematic diagram showing a columnar structure, however the present invention is not limited hereto. A granular structure means a thin film structure having massive crystals growing on the substrate and FIG. 4 illustrates a schematic diagram showing a granular structure, however, the present invention is not limited hereto. Actual conditions of crystal grain layers and crystal grain shapes can be perceived by observation with a scanning electron microscope (SEM).

Also, a semiconductor device according to still another aspect of the present invention comprises a MOS transistor formed on the semiconductor substrate, an interlayer insulating film formed on said mos transistor, a contact plug disposed in said interlayer insulating film and connected to a diffusion layer contained in said MOS transistor, a lower electrode film formed on said contact plug, a dielectric oxide thin film formed on said lower electrode film, and an upper electrode film formed on said dielectric oxide thin film, wherein said lower electrode film is composed of a crystal grain laminated structure containing a columnar structure crystal grain layer and a granular structure crystal grain layer.

In addition to the above, a semiconductor device according to still another aspect of the present invention comprises a MOS transistor formed on the semiconductor substrate, an interlayer insulating film formed on said MOS transistor, a contact plug disposed in said interlayer insulating film and connected to a diffusion layer contained in said MOS transistor, a barrier layer formed on said contact plug, a lower electrode film formed on said barrier layer, a dielectric oxide thin film formed on said lower electrode film, and an upper electrode film formed on said dielectric oxide thin film, wherein said barrier layer is a granular structure crystal grain layer made of tantalum nitride containing 10 atm % or more and 50 atm % or less of nitrogen.

Here, a contact plug is illustrated with a MOS transistor formed on the semiconductor substrate, an interlayer insulating film formed on this transistor, and a contact plug made of polycrystalline Si filling an aperture portion that is disposed in this interlayer insulating film so as to reach a diffusion layer of said MOS transistor. Polycrystalline Si is often used for contact plugs, but tungsten (W), tungsten silicide (Wsix), and titanium silicide (TiSix) are also employed.

In the present invention, a barrier layer may be formed between said lower electrode film and contact plug. The barrier layer is used to prevent substance from diffusing mutually among such films as the semiconductor substrate, electrode films, and dielectric oxide thin films, and to improve adhesion between the film and TiN and $TiSi_2$ are preferable for the barrier layer. The barrier layer can consist of either a single-layer or multi-layers.

Moreover, in the present invention, it is preferable for a crystal grain layer which is contained in said crystal grain laminated structure and touching said dielectric oxide thin film to have a granular structure, however, the present invention is not limited hereto. As examples of the crystal grain laminated structure of the present invention, when starting the description from the film touching the dielectric oxide thin film, columnar/massive, such examples of massive/columnar, columnar/massive/columnar, massive/columnar/massive, and a large number crystal grain layers are provided.

A method of manufacturing a semiconductor device according to the present invention comprises the steps of forming columnar structure crystal grain layers by a sputtering method or a CVD (Chemical Vapor Deposition) method and forming massive crystal grain layers by the sputtering method or the CVD method, in forming electrode films having crystal grain laminated structure containing columnar structure crystal grain layers and granular structure crystal grain layers.

The forming crystal grain layers by the sputtering method in the present invention is explained concretely as follows. A target is placed, facing the semiconductor substrate and in an Ar gas atmosphere high frequency waves are generated between the semiconductor substrate and the target to discharge electricity and to accumulate a substance constituting a thin film on the semiconductor substrate. After that by heating and annealing it the accumulated substances is crystallized and forms an electrode film having prescribed shapes and diameters of the crystal grains. There is a case of the reactive sputtering method wherein, nitrogen gas, which constitutes a thin film as an ingredient, is mixed with Ar gas to make the accumulating substance absorb gas constituents. This procedure is applied to produce an electrode film made of tantalum nitride. Various conditions including the kinds of target employed, pressure of Ar gas, frequency of high-frequency waves, temperatures of discharging electricity, and film forming temperatures are optimized by the kind of shapes and diameters of the crystal grains to be formed.

The forming crystal grain layers by the CVD method in the present invention is explained concretely as follows. Mixture of the substance constituting a thin film and highly volatile substance, particularly organic metallic compounds composed of trimethyl, tri-isobutyl or dimethylhalide, and metals are adsorbed on the semiconductor substrate and then such volatile substances are removed. Since removal of volatile substances and crystallization is conducted under heating conditions and take advantage of reactions occurring on the surface of the semiconductor substrate, atoms adsorbed on the semiconductor substrate move on the surface and a film excellent in coating an uneven surface can be formed. Various conditions including the kind of the organic metallic compounds employed and a temperature of forming films are optimized by the kind of shapes and diameters of the crystal grains to be formed.

The forming an electrode film composed of either a single columnar structure crystal grain layer or a single granular structure crystal grain layer is already publicly known, however, forming a granular structure crystal grain layer was relatively more difficult than forming a columnar structure crystal grain layer, due to limits on the most suitable conditions. It has been very difficult to form an electrode film having a multiple crystal grain layer structure since the most suitable conditions were more limited. However, as explained above, by bringing the manufacturing conditions under strict control, it became possible to manufacture such an electrode film. In the present invention, by adopting crystal grain structure to an electrode film that contains crystal grain layers both in the columnar structure and granular structure, the following effects can solve the problems explained above.

Firstly, a problem, wherein since a dielectric oxide thin film is formed in an oxidization atmosphere, diffusion of oxygen occurs while the electrode film made of columnar structure crystal grain layers are being formed, whereby oxidization of a contact plug, connected to an electrode film, or a TiN barrier layer is caused, is solved. More specifically, if crystal grain layers having crystal grain shapes in the granular structure exists in the electrode film formed in a crystal grain laminated structure, oxygen does not pass through the electrode film, for the diffusion speed of oxygen infiltrating the boundary of each crystal grain is extremely slow. However, since micro-crystal grains constitute the granular structure, although the oxygen barrier performance is excellent, resistance is also high and results in conduction failure. On the other hand, since in a crystal grain layer formed in the columnar structure, the diameters of crystal grains are large and crystal grain fields exist along the direction of electric conduction, resistance is low and conductivity is good. Therefore, by laminating crystal grain layers constituted by these different crystal grain shapes and forming an electrode film, both of the oxygen barrier performance and conductivity, good for practical use, can be realized.

The performance and productivity needed for electrode films determine what shape grains should a crystal grain layer have and how many layers should be laminated and in what order they should be done. By controlling the crystal grain laminated structure of the electrode films, the electrode films that have both the oxygen barrier performance and conductivity, good for practical use, can be provided by a method suitable for multiple purposes, which is easier than developing new constituents of the electrode films. As a result, while the films of dielectric oxide are formed, the contact plugs or barrier layers cannot be oxidized and resistance at the electrodes does not increase. Adhesion to the electrode films remains to be good, as well. Secondly, an aging problem, wherein after the dielectric oxide thin film is formed, interdiffusion of constituent substances including oxygen is occurred through the electrode film between the dielectric oxide thin film and contact plug or barrier film, and resulting in conduction failure or peeling on the jointed surface between respective films, is solved. More specifically, if crystal grain layers having the crystal grain shapes in the granular structure exist in the electrode film formed in a crystal grain laminated structure, diffusion of the substance including oxygen can be prevented and no substance including oxygen can pass through the electrode film. On the other hand, while the crystal grain layers having a crystal grain shapes in the columnar structure have low substrate barrier performance, they have good conductivity. It takes considerable time and cost if development of a new electrode film is started from search of new materials constituting the electrode film, for the purpose of developing the new electrode film that can have both of the excellent substance barrier performance and conductivity, which are good for practical use. Compared with the above, production of the electrode film formed in a crystal grain laminated structure containing the crystal grain layers both in the columnar structure and the granular structure can realize both the barrier performance and conductivity even thought its constituents remain unchanged as they are now. As a result, oxidization of the contact plug or barrier layer while the dielectric oxide thin film is being formed can be prevented and moreover, such aging problems as the insufficient rewritability of dielectric memory can be solved, as well.

Thirdly, fatigue characteristics of the dielectrics oxide material can be improved. The main causes of the fatigue characteristics include diffusion of the metals constituting the electrode film into the dielectric oxide thin film, leakage currents by way of crystal grain fields in the dielectric oxide thin film, dispersion of oxygen atoms (oxygen holes) in the lattice of the dielectric oxide thin film. These causes can be solved if crystallinity of the dielectric oxide thin film is improved, and the following explains how it should be realized. That is, the crystallinity of the dielectric oxide thin film is affected by the crystallinity of the electrode film it touches. Accordingly, by controlling the crystal grain shapes and diameters of the crystal grains in the electrode film that touches the dielectric oxide thin film and crystallizing such crystal grain layers, crystallinity of the dielectric oxide thin film can be improved. Generally speaking, since the crystal grain layers in the columnar structure have better crystallinity than those in the granular structure, the crystal grain layer touching the dielectric oxide thin film can be made to have a columnar structure when necessary. If the crystal grain layer next to the above layer is made to have the granular structure, the substance barrier performance can be obtained. By making the electrode film have a crystal grain multi-layer structure, composed of a plurality of crystal grain layers, and controlling such crystal grain multi-layer structure, all the performance required of the electrode film such as crystallinity, conductivity and the substance barrier performance can be satisfied.

Fourthly, anti-oxidation characteristics of the barrier layer can be improved. That is, when the barrier layer is formed of a granular structure crystal grain layer made of tantalum nitride containing 10 atm % or more, preferably 15 atm % or more, more preferably 20 atm % or more and 50 atm % or less of nitrogen, preferably 45 atm % or less, more preferably 36 atm % or less of nitrogen, its anti-oxidation characteristics can be improved.

Further, in the case where the electrode film is formed in the above-mentioned barrier layer, c-axis orientation of the crystal grains constituting the electrode film improves and the number of routes through which oxygen infiltrates decreases. Therefore, the oxygen barrier performance of the electrode film further improves and oxidization of the barrier layer can further be inhibited. Also, since the dielectrics oxide to be formed on the electrode film whose c-axis orientation is improved has further improved crystallinity, the fatigue characteristics of the obtained FeRAM can further be improved and the obtained DRAM can have larger capacity.

As explained above, by making the electrode film have a crystal grain multi-layer structure, the semiconductor device of the present invention can realize the good substance barrier performance, good current conductivity and high crystallinity at such electrode film by a multi-purpose manufacturing method, which is easier than investigating new constituents for the electrode film. As a result, such dielectric capacitor can work well without causing any deterioration of its performance even after it is used for a long time and a semiconductor device can have dielectric memory with good rewriting performance.

In addition, by making the barrier layer to be a granular structure crystal grain layer made of tantalum nitride containing 10 atm % or more and 50 atm % or less nitrogen, anti-oxidation characteristics of the barrier layer can be improved, and whereby resistance of the barrier layer cannot be increased, whereas its peeling can be prevented.

BRIEF DESCRIPTION OF THE DRAWINGS

The foregoing and other features and advantage of the present invention will become more readily more appreciated as the same becomes better understood by reference to the following detailed description when taken into conjunction with the accompanying drawings wherein.

DETAILED DESCRIPTION OF THE PREFERRED EMBODIMENTS

Hereinafter, concrete explanation of the preferred embodiments of the present invention is given with reference to attached drawings.

Figure 1:
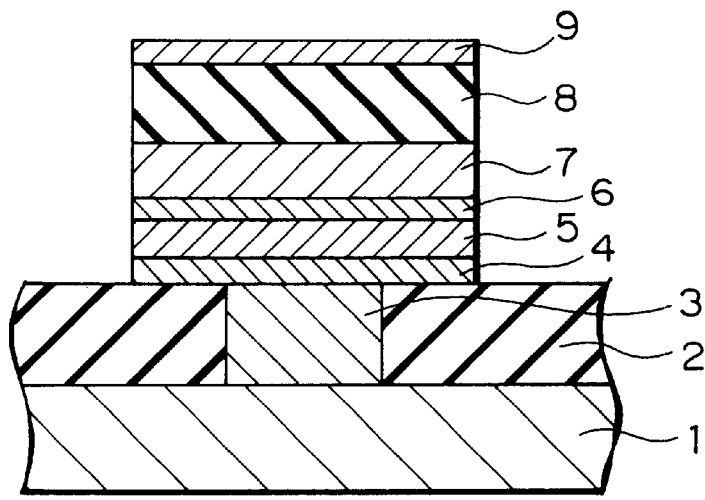
FIG. 1 is a schematic sectional view showing a first embodiment of the present invention.

FIG. 1 is a sectional view showing an embodiment of the invention applied to a FeRAM. A FeRAM is produced in the following procedure. A thermally oxidized $SiO_2$ interlayer insulating film 2 is formed to be, for instance, 600 nm thick on a Si semiconductor substrate 1 where a MOS transistor has been formed, an aperture that reaches a diffusion layer of the MOS transistor (not shown in the drawing) is provided in this interlayer insulating film 2, and the aperture is filled up with a contact plug 3 made of polycrystalline Si. On this contact plug 3, a barrier layer 4 made of $TiSi_2$ layer (for instance, 30 nm thick) and a barrier layer 5 made of TiN layer (for instance, 50 nm thick) are laminated sequentially as barrier layers.

On the TiN barrier layer 5, a Pt layer 6 having a crystal grain diameter of approximately 5 nm is formed, for instance, 30 nm thick as a granular structure crystal grain layer composing a lower electrode film. This Pt layer 6 is formed by a sputtering method.

On this Pt layer 6, a Pt layer 7 having a crystal grain diameter of approximately 100 nm is deposited to be, for instance, 100 nm thick as a columnar structure crystal grain layer composing the lower electrode film. This Pt layer 7 can be formed by the sputtering method at a film forming temperature of 400° C.

On this Pt layer 7, a PZT layer 8 is laminated by the sputtering method as a dielectric oxide thin film, to be, for instance 200 nm thick. The film forming temperature is 600° C. Then, a Pt layer 9 is laminated to be, for instance, 50 nm thick as an upper electrode film. After that, the Pt layer 9, PZT layer 8, Pt layers 7 and 6, TiN barrier layer 5 and $TiSi_2$ barrier layer 4 are patterned by photolithography and a thin film capacitor composing FeRAM is formed.

In this semiconductor device, resistance between the MOS transistor and the lower electrode film having a crystal grain laminated structure of Pt layers is low enough and so the device works stably and adherence of the lower electrode film (Pt layers 6 and 7) is favorable. Fatigue properties of the dielectric oxide thin film (PZT layer 8) produces good results and after the device was used for many hours, its performance did not deteriorate.

When this FeRAM was actually produced under the film forming conditions explained in the above example, it worked stably and adhesion of the lower electrode film was favorable. Further, its performance did not deteriorate after it was used for many hours.

Figure 2:
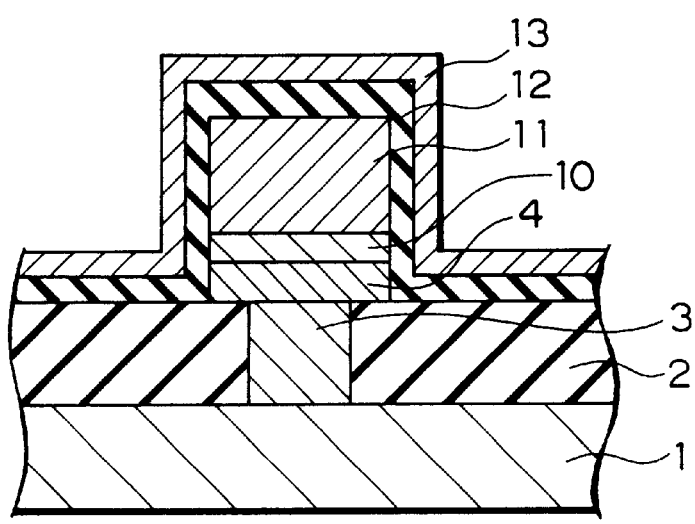
FIG. 2 is a schematic sectional view showing a second embodiment of the present invention.
Figure 3:
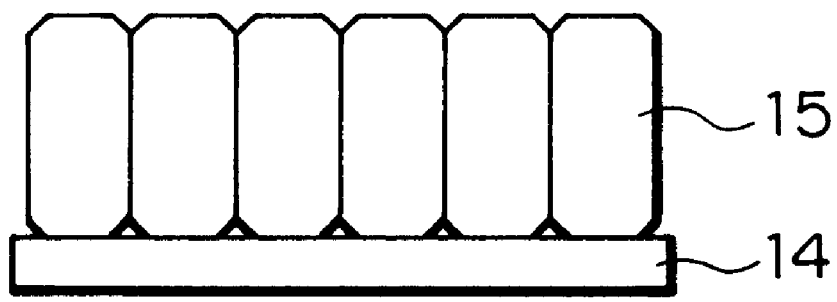
FIG. 3 is a schematic diagram showing a columnar structure.
Figure 4:
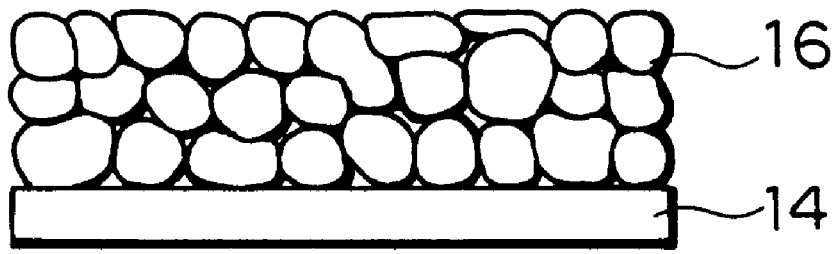
FIG. 4 is a schematic diagram showing a granular structure.

Next, with reference to FIG. 2, a second embodiment of the present invention is explained. In this embodiment, the present invention is applied to a DRAM. An interlayer insulating film 2 made of $SiO_2$ layer is formed to be, for instance, 600 nm thick on the Si semiconductor substrate 1 where a MOS transistor has been formed in advance, and an aperture reaching a diffusion layer (not shown in the drawing) of the MOS transistor is disposed in this interlayer insulating 2, and a contact plug 3 made of polycrystalline Si is provided in the aperture.

On this contact plug 3, a barrier layer 4 (for instance, 30 nm thick) made of $TiSi_2$ is laminated. On this barrier layer 4, a tantalum nitride film having crystal grains whose diameter is approximately 5 nm is formed to be, for instance, 20 nm thick as a massive structural crystal grain layer 10 composing a lower electrode film. The tantalum nitride film of this crystal grain layer 10 can be formed by a reactive sputtering method in an atmosphere of mixed nitrogen and argon gas.

On this crystal grain layer 10, an Ru layer having crystal grains whose diameter of, for instance, 100 nm is formed to be, for instance, 100 nm thick as a columnar structural crystal grain layer 11 composing the lower electrode film. This Ru layer is formed by the sputtering method at a film forming temperature of 500° C., with a DC power of 1.7 kW and film forming pressure of 10 mTorr.

Next, laminated layers composed of the Ru crystal grain layer 11, the tantalum nitride crystal grain layer 10 and the $TiSi_2$ barrier layer 4 were patterned into, for instance, 0.2 $\mu$m in width by photolithography and processed into a three-dimensional stack electrode, shown in FIG. 2, by plasma etching.

Then, a dielectric oxide thin film 12 made of a BST layer is deposited on the Ru crystal grain layer 11 on the wafer by the electron cyclotron resonance plasma CVD method at a film forming temperature of 500° C., for instance. In this case, since step coverage is about 40%, on the side wall of the electrode, the dielectric oxide thin film 12 made of the BST layer of approximately 30 nm thick is laminated. To form the film, bis(dipivaloymethanate)barium $(Ba(DPM)_2)$, bis(dipivaloymethanate)strontium $(Sr(DRM)_2)$, titanium isopropoxide $(Ti(O\text{-}i\text{-}C_3H_7)_4$; TIP for short) and $O_2$ can be used as raw materials (feedstocks). For instance, here, the supplied amount of raw materials can be adjusted so that a ratio of (barium+strontium)/titanium becomes 0.97, and that of barium/(barium+strontium) becomes 0.5. After that, the upper electrode film 13 made of Ru is laminated to be, for instance, 50 nm thick by the sputtering method. Thereby, a thin film capacitor composing DRAM is completed.

In this semiconductor device, resistance between the MOS transistor and the lower electrode film comprising a crystal grain laminated structure composed of a Ru crystal grain layer 11 and a tantalum nitride crystal grain layer 10 is low enough and so stable DRAM operation can be obtained. At the same time, adherence of the lower electrode is favorable and such favorable conditions can be maintained for many hours.

According to the above embodiments, an electrode film laminated with crystal grain layers having different crystal gain shapes is produced by using publicly known metal materials such as Pt, Ru, and tantalum nitride whereby both good barrier performance and conductivity can be realized. In addition, a columnar structure crystal grain layer is made into contact with the dielectric oxide thin film, whereby fatigue characteristics of the dielectric oxide thin film can be effectively improved.

As a matter of fact, when this DRAM was produced under the film forming conditions explained in the above example, stable operation was obtained and adherence of the lower electrode film was preferable, too, and deterioration of performance after being used for many hours was not observed.

Figure 5:
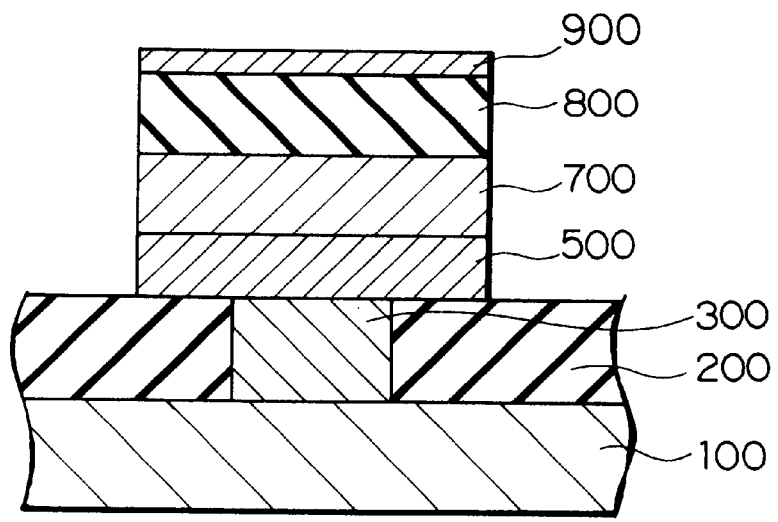
FIG. 5 is a schematic sectional view showing a third embodiment of the present invention.

Next, a third embodiment of the present invention is explained with reference to FIG. 5. The present invention is applied to a FeRAM in this embodiment. A thermally oxidized $SiO_2$ interlayer insulating film made, 200 is laminated to be, for instance, 600 nm thick on a Si semiconductor substrate, 100 where a MOS transistor is formed, and an aperture reaching a diffusion layer (not shown in the drawing) of the MOS transistor is provided in this interlayer insulating film 200, and the aperture filled up with a polycrystal Si contact plug 300.

On this contact plug 300, a barrier layer 500 made of tantalum nitride containing 30 atm % of nitrogen is laminated to be, for instance, 50 nm thick. The layer can be laminated by making use of mixed Ar and $N_2$ gas by the reactive sputtering method. The conditions required for forming the film are a substrate temperature of 200° C., DC power of 4 kW, film forming pressure of 0.3 Pa, and $N_2$ partial pressure of 40%.

Figure 9:
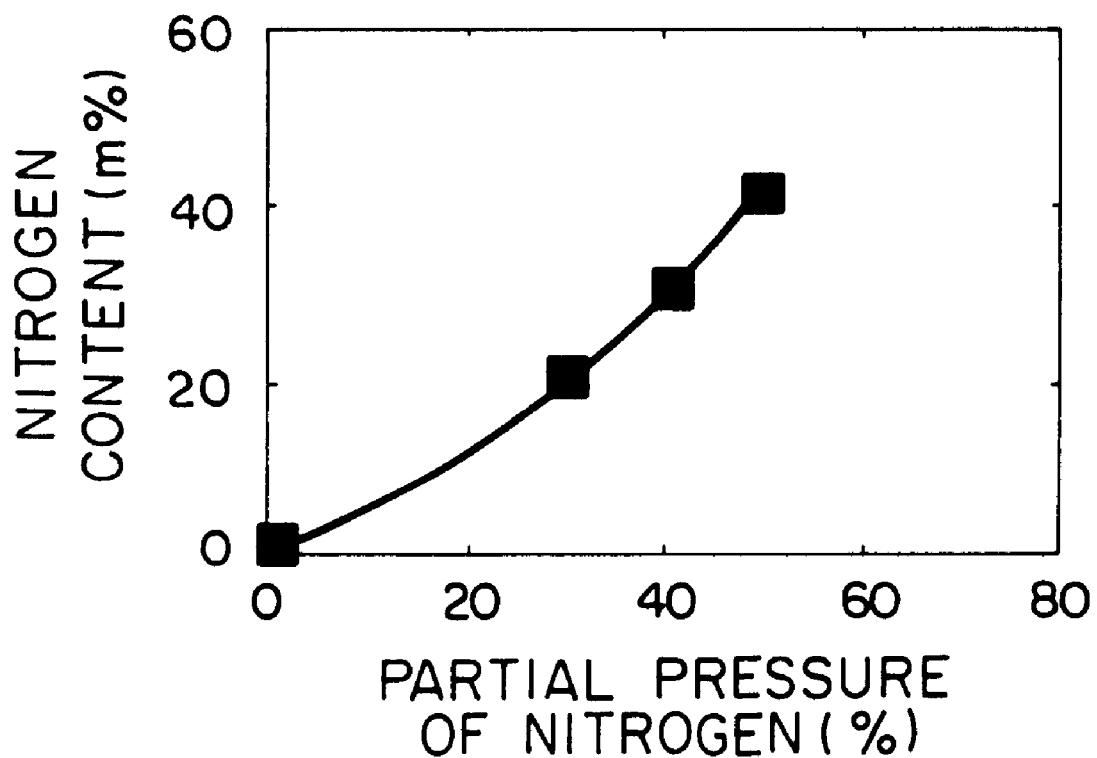
FIG. 9 is a graph showing the relationship between partial pressure of nitrogen and nitrogen content when barrier layers are formed in the present invention.

FIG. 9 is a graph showing the relationship between partial pressure of nitrogen and nitrogen content during this film forming process. As shown in FIG. 9, by setting the partial pressure of $N_2$ to 40%, a film of tantalum nitride containing 30 atm % of nitrogen can be formed and observation of the crystal grain layer with a SEM can confirm a granular structure having a grain diameter of 5 nm.

Thereon, a Pt layer having grain diameter of approximately 100 nm is formed to be, for instance, 200 nm thick as a columnar structure crystal grain layer 700 composing a lower electrode film. This Pt crystal grain layer 700 can be formed by the sputtering method. A PZT layer is laminated to be, 200 nm thick, by the sputtering method as a dielectric oxide thin film 800 on this Pt crystal grain layer 700. This film forming temperature of this dielectric oxide thin film 800 is 600° C. Subsequently, a Pt layer 900 is laminated to be, 50 nm thick as an upper electrode film and the films are patterned by photolithography, whereby a thin film capacitor comprising a FeRAM is completed.

In this semiconductor device, resistance between the MOS transistor, and the barrier layer and lower electrode film is low enough and stable operating characteristics can be obtained. Also, adhesion between the barrier layers and lower electrode film is favorable.

When this FeRAM was actually produced under the film forming conditions explained in the above example, stable operation was obtained and adhesion of the lower electrode film was favorable. Further, performance deterioration was not observed after it was used for many hours.

Next, a fourth embodiment of the present invention is explained with reference to FIG. 6. The present invention is applied to a DRAM in this embodiment. A $SiO_2$ layer 200, is formed to be, for instance, 600 nm thick, on a Si semiconductor substrate 100 where a MOS transistor has been formed in advance, and an aperture reaching a diffusion layer (not shown in the drawing) of the MOS transistor is provided in this interlayer insulating film 200, and a polycrystal Si contact plug 300 is provided in the aperture. On this contact plug, a barrier layer 400 made of tantalum nitride containing 30 atm % nitrogen is laminated, for instance, 50 nm thick. The film is produced with mixed Ar and $N_2$ gas by the reactive sputtering method. The conditions required for forming a film are a substrate temperature of 200° C., DC power of 4 kw, film forming pressure of 0.3 Pa, and partial pressure of $N_2$ of 40%.

As shown in FIG. 9, by setting the partial pressure of $N_2$ 40%, a film of tantalum nitride containing 30 atm % nitrogen can be formed and observation of the crystal grain layers constituting this film made of tantalum nitride with SEM can prove that it has a granular structure and crystal grains whose diameter is 5 nm.

On this barrier layer 400, an Ru layer having crystal grains whose diameter is approximately 100 nm is formed, for instance, approximately 100 nm thick as a columnar structure crystal grain layer 110 constituting the lower electrode film. This Ru layer is formed, for instance, by the sputtering method at a firm forming temperature of 500° C., with DC power of 1.7 kw, and film forming pressure of 1.5 Pa.

Figure 6:
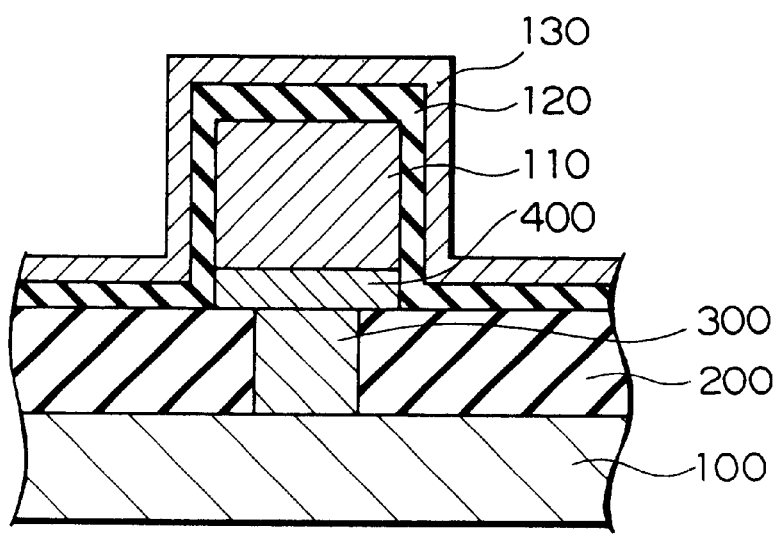
FIG. 6 is a schematic sectional view showing a fourth embodiment of the present invention.

Laminated layer structures made up of the Ru crystal grain layer 110 and the tantalum nitride barrier layer 400 are patterned by photolithography, (for instance, about 0.2 $\mu$m in width) and processed into a three-dimensional stack electrode by plasma etching, shown in FIG. 6.

Then, a dielectric oxide thin film 120 made of a BST layer is laminated by the electron cyclotron resonance plasma CVD method on the Ru crystal grain layer 110 in the wafer at a film forming temperature of 500 degrees Celsius, for instance. In this case, since step coverage is about 40%, the BST layer, approximately 30 nm thick, is laminated on the sidewall of the electrode. To form the film, bisdipivaloyl-methanoic acid barium, disdipivaloylmethanoic acid strontium and isopropyl oxide titanium, for instance, can be used as ingredients. Here, the amount supplied of ingredients can be adjusted so that a ratio of (barium+strontium)/titanium may be 0.97, and that of barium/(barium+strontium) may be 0.5. After that as an upper electrode film 130 the Ru layer is laminated, for instance, 50 nm thick, by the sputtering method. The above procedures complete a thin film capacitor that comprises a DRAM according to the present invention.

In this semiconductor device, resistance between the barrier layer and the lower electrode film is low enough and so a stable operation is obtained. Also, adhesion between the barrier layers and the lower electrode film is good. When this DRAM was actually produced under the film forming conditions shown in the above example, a stable operation was obtained with good adhesion to the lower electrode film and deterioration of its performance was not observed even after it was used for a long time.

The size of the crystal grains is represented by the diameters of the crystal grains and in terms of the columnar structure, such diameter denotes a diameter of a circle circumscribing the bottom surface of a column and in terms of the granular structure, such diameter means a diameter of a sphere circumscribing an entire block. If diameters of the crystal grains vary, the size of the crystal grains is represented by an average diameter of the grains.

For the present invention, it is preferable that the average diameter of crystal grains constituting the crystal grain layers formed in said columnar structure be 10 nm or more and 500 nm or less. Since conductivity of the columnar structure depends on the diameters of the crystal grains, larger diameters of the crystal grains are preferable. Also, since the crystal grains having larger diameters have high crystallinity of the crystal grains, particularly if the crystal grain layer formed in a columnar structure touches a dielectric oxide thin film, the crystallinity of the dielectric oxide thin film is higher and aging fatigue characteristic of the dielectric oxide thin film is restrained. Accordingly, it is favorable that the lower limit of the diameters of the crystal grains in the columnar structure be 10 nm or more, preferably 20 nm or more and more preferably 30 nm or more. On the other hand, due to limits in production techniques, it cannot be said that the larger the diameters are, the better, as a matter of fact. The upper limit of the diameters is 500 nm or less, preferably 400 nm or less and more preferably 300 nm or less. Also, from the standpoint of the required performance of the electrode film and manufacturing cost, the lower limit of the thickness of the crystal grain layers are 10 nm or thicker when necessary, preferably 20 nm or thicker and more preferably 30 nm or thicker. The upper limit of the thickness is 500 nm or thinner, preferably 400 nm or thinner and more preferably 300 nm or thinner.

Further, for the present invention, it is preferable that the average diameter of the crystal grains constituting the crystal grain layers in said granular structure be 1 nm or more and 30 nm or less. Compared with the columnar structure, the granular structure has generally micro-crystal grains, but if the diameter of the crystal grains is too small, the layers enter amorphous state and conductivity is impaired. Accordingly, the lower limit of the diameter of the crystal grains in the granular structure is 1 nm or more, preferably 2 nm or more and more preferably 3 nm or more. On the other hand, if the diameter of the crystal grains in the granular structure is too large, the surface flatness and smoothness is lost and adhesion to the upper layers is impaired. Accordingly, the upper limit should be 30 nm or less, preferably 25 nm or less and more preferably 20 nm or less. Also, from the standpoint of the performance requirement of the electrode film and manufacturing cost, the lower limit of the thickness of the crystal grain layers should be the same as the diameter of the crystal grains when necessary. The upper limit of the thickness is 500 nm or thinner, preferably 400 nm or thinner and more preferably 300 nm or thinner.

Actual diameters of the crystal grains and thickness of the crystal grain layers can be confirmed through observation using an SEM. The average diameters of the crystal grains can be obtained by image analysis of the obtained SEM images.

It is preferable that the dielectric oxide thin films employed for the present invention be made of either perovskite oxide or tantalum oxide. It is acceptable that the dielectric oxide thin films employed for the present invention be made of either monometallic oxide or ABO3 type perovskite oxide. $Ta_2O_5$ is an example of the monometallic oxide, but this in not limited hereto. As for $ABO_3$ type perovskite oxide, A represents one or more elements chosen from among Ba, Sr, Pb, La, and bivalent metals and B represents one or more elements chosen from among Ti, Zr, and tetravalent metals. For instance, SrTiO3, $Ba_xSr_{1-x}TiO_3$ (BST), $PbZr_xTi_{1-x}O_3$(PZT), $Pb_{1-y}La_yZr_xTi_{1-x}O_3$(PLZT) and $SrBi_2Ta_2O_9$ are preferably used, for these dielectric oxides have a perovskite crystal structure and high specific inductive capacity. Also, the dielectric oxide thin films used for the present invention can be chosen from ABO3 type perovskite oxide, such as $Ta_2O_5$, $SrBi_2Ta_2O_9$, and $Bi_4Ti_3O_{12}$.

The electrode film employed for the present invention can be made of non-oxide metals, metals that are conductive even when they are oxidized, alloys of such metals, or compounds containing such metals. Non-oxide metals mean metals that cannot form any oxide, and metals of platinum family, such as Pt, are preferably used. As metals that are conductive even when they are oxidized, Ir, Ru, and Os are preferably used. These non-oxide metals and metals that are conductive even when they are oxidized can bring shapes and diameters of the crystal grains under control by a manufacturing method disclosed in the present invention and are suitable for manufacturing the electrode films having necessary performance.

The electrode films can be composed of W when necessary. Also, the electrode films can be composed of conductive perovskite oxide when necessary. Out of conductive perovskite oxide, $SrRuO_3$ and $BaRuO_3$ are preferable.

At least one of said electrode films employed for the present invention can be made of tantalum nitride. As ingredients of said electrode films tantalum nitride can be used and crystal grain layers in the granular structure can be formed by the reactive sputtering method. The crystal grains of the tantalum nitride thin films formed by the reactive sputtering method have massive shapes. Production of the crystal grain layers in the granular structure was relatively difficult up to now, but by forming thin films made of tantalum nitride by the reactive sputtering method, the crystal gain layers in the granular structure can easily be produced.

Further, there is a case where in order to secure the action of the barrier layers, films supporting the barrier layers may be formed. For instance, a silicide film is sometimes formed between a contact plug and a barrier layer. Good examples of silicide films are $TiSi_2$ and $TaSi_2$, but if the barrier layers are made of tantalum nitride, $TaSi_2$ can be used to facilitate the production.

In addition, there is a case where in order to improve adhesion at the contact plug, the plug is embedded in a contact hole disposed in the interlayer insulating film and reaching a diffusion layer.

The barrier layers composed of the tantalum nitride crystal grain layers in the granular structure can be formed from mixed gas of Ar and $N_2$ by the reactive sputtering method. The nitrogen content of the obtained barrier layers can be brought under control by setting the partial pressure of $N_2$ a prescribed value in the reactive sputtering method. The actual nitrogen content in the barrier layers can be decided by an RBS analysis (Rutherford backscattering analysis).

Next, results obtained through examining the characteristics of a semiconductor device produced by a method of the present invention and substantiated effects of the present invention are explained.

EXAMPLE 1

A composition of barrier layer (tantalum nitride)/a lower electrode film (Ru)/a dielectric oxide thin film (BST) was produced in the same manner as the fourth embodiment, except that the nitrogen content of tantalum nitride constituting the barrier layer was changed, and that the thickness of the Ru film, as the lower electrode film, was changed to 120 nm, and the film forming temperature of the BST layer, as the dielectric oxide thin film, was changed to 500° C. and 550° C.

Figure 7:
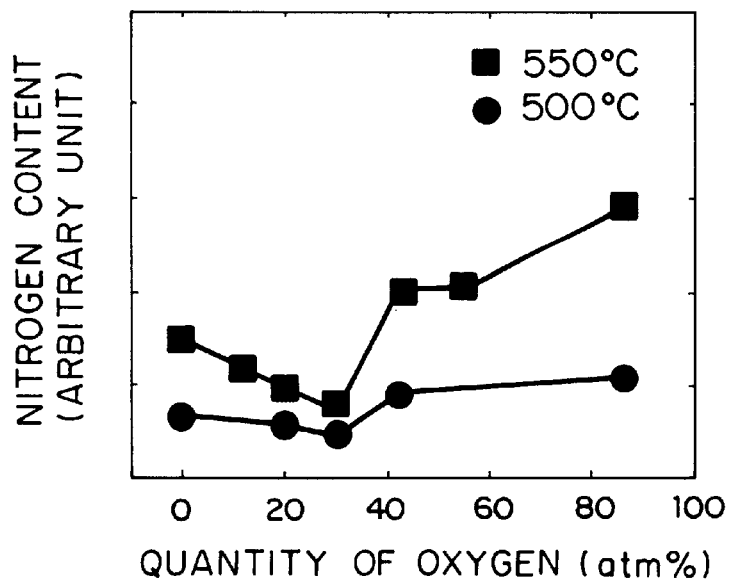
FIG. 7 is a graph showing the relationship between nitrogen content and quantity of oxygen existence in barrier layers of the present invention.

After that, the quantity of oxygen existence in the barrier layer was measured by AES (Auger Electron Spectroscopy) in-depth profile with PHI-660 manufactured by Perkin-Elmer. The measured quantity of oxygen existence was standardized in consideration of absorbency from Ru and its results are shown in FIG. 7. ● and ■ show the results when the film forming temperature of the BST layer was 500° C. and 550° C., respectively. The results indicate that if the nitrogen content is 10 atm % or more and 50 atm % or less, quantity of oxygen existence in the tantalum nitride decreases, in other words, oxidation of the barrier layer is inhibited.

Further, a composition of the barrier layer (tantalum nitride)/the lower electrode film (Ru)/the dielectric oxide thin film (BST) was produced at such different film forming temperatures, as 450° C., 500° C. and 550° C., and a peeling test of the barrier layer and the lower electrode film was conducted. The results are shown in Table 1 below. The results indicate that when the nitrogen content was 10 atm % or more and 50 atm % or less, anti-peeling characteristics was improved.

TABLE 1

| Nitrogen content (atm %) | Film forming temperature of the BST layer 450° C. | Film forming temperature of the BST layer 500° C. | Film forming temperature of the BST layer 550° C. |
|---|---|---|---|
| 0 | No peel | Peel | Peel |
| 5 | No peel | Peel | Peel |
| 12 | No peel | No peel | Peel |
| 20 | No peel | No peel | No peel |
| 30 | No peel | No peel | No peel |
| 42 | No peel | No peel | Peel |
| 55 | No peel | Peel | Peel |
| 86 | No peel | Peel | Peel |

By setting the partial pressure of $N_2$ at a prescribed value, for instance in the reactive sputtering method, nitrogen content can be brought under control. FIG. 9 shows an example of the relationship between the partial pressure of $N_2$ and nitrogen content in the barrier layer. Based on the RBS analysis, the actual nitrogen content in the barrier layer was decided. The RBS analysis equipment is composed of an accelerator and a detector and the accelerator employed was Tandem accelerator Pelletron type 1 MV manufactured by NEC and the detector was an RBS end station RBS-400 manufactured by Charles Evans & Associates.

EXAMPLE 2

A composition of A barrier layer (tantalum nitride)/a lower electrode film (Ru)/a dielectric oxide thin film (BST) were produced by changing the nitrogen content in the tantalum nitride constituting the barrier layer, forming an Ru film, 120 nm thick, as the lower electrode film and forming the BST layer as the dielectric oxide thin film at the film forming temperature of 550° C.

Figure 8:
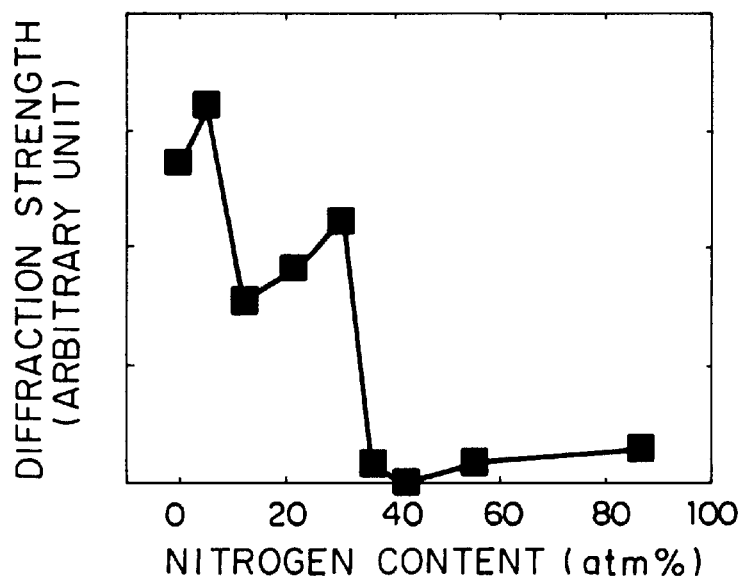
FIG. 8 is a graph showing the relationship between nitrogen content in barrier layers and diffraction strength of Ru composing a lower electrode film, in the present invention.

After that, (002) diffraction strength of the Ru was measured through x-ray diffraction measurement by using RAD-3C manufactured by Rigakusha. The measured diffraction strength was standardized in consideration of incident beam intensity and FIG. 8 shows the results. C-axis orientation of the Ru is reflected in the (002) diffraction strength and FIG. 8 indicates that the c-axis orientation changes, depending on the nitrogen content in the barrier layer. Particularly, in the case where the nitrogen content is 20 atm % or more and 36 atm % or less, the c-axis orientation on the Ru film is high. In that case, the oxygen barrier performance of the Ru electrode film was good and the fatigue characteristics of the BST were also improved.

What is claimed is:

1. A semiconductor device comprising
a thin-film capacitor having a dielectric oxide thin film and a pair of electrode films laminating the dielectric oxide thin film therebetween, wherein
at least one of said pair of electrode films consists of a crystal grain laminated structure containing a columnar structure crystal grain layer formed of crystal grains having an average grain diameter of 10 nm or more and 500 nm or less, and a granular structure crystal grain layer formed of crystal grains having an average grain diameter of 1 nm or more and 30 nm or less.

2. A semiconductor device as set forth in claim 1, wherein a crystal grain layer, which is contained in said crystal grain laminated structure and comes into contact with said dielectric oxide thin film, has a columnar structure.

3. A semiconductor device as set forth in claim 2, wherein said dielectric oxide thin film is made of perovskite oxide or tantalum oxide.

4. A semiconductor device as set forth in claim 1, wherein at least one of said electrode films is made of tantalum nitride.

5. A semiconductor device comprising
a thin-film capacitor having a dielectric oxide thin film and a pair of electrode films sandwiching said dielectric oxide thin film therebetween,
a contact plug connected to at least one of said electrode films, and
a barrier layer formed between said electrode film and contact plug, said barrier layer being a granular structure crystal grain layer made of tantalum nitride containing 10 atm % or more and 50 atm % or less of nitrogen, wherein at least the electrode film connected to the contact plug is a crystal grain laminated structure containing a columnar structure crystal grain layer formed of crystal grains having an average grain diameter of 10 nm or more and 500 nm or less, and a granular structure crystal grain layer formed of crystal grains having an average grain diameter of 1 nm or more and 30 nm or less.

6. A semiconductor device as set forth in claim 5, wherein the average diameter of crystal grains composing a granular structure crystal grain layer of said barrier layer is 1 nm or more and 30 nm or less.

7. A semiconductor device as set forth in claim 5, wherein said columnar structure crystal grain layer, which is contained in said crystal grain laminated structure, is in contact with said dielectric oxide thin film.

8. A semiconductor device as set forth in claim 5, wherein said dielectric oxide thin film is made of perovskite oxide.

9. A semiconductor device as set forth in claim 5, wherein said dielectric oxide thin film is made of ABO3 type perovskite oxide, wherein A comprises one or more elements selected from the group consisting of Ba, Sr, Pb, La, and a bivalent metal, and B represents one or more elements selected from the group consisting of Ti, Zr, a tetravalent metal, $Ta_2O_5$, $SrBi_2Ta_2O_9$, and $Bi_4Ti_2O_{12}$.

10. A semiconductor device as set forth in claim 5, wherein at least one of said electrode films is made of Ru, Pt, Ir, or W.

11. A semiconductor device as set forth in claim 5, wherein at least one of said electrode films is made of conductive perovskite oxide.

12. A semiconductor device as set forth in claim 11, wherein said conductive perovskite oxide is $SrRu_3$ or $BaRuO_3$.

13. A semiconductor device as set forth in claim 5, wherein a silicide film is formed between said contact plug and said barrier layers.

14. A semiconductor device according to claim 13, wherein said silicide film is $TaSi_2$.

* * * * *